(12) United States Patent
Stillfried et al.

(10) Patent No.: US 8,487,752 B2
(45) Date of Patent: Jul. 16, 2013

(54) EXTERNAL STATUS INDICATOR FOR AN ELECTRIC VEHICLE

(75) Inventors: Edward V. Stillfried, Rochester Hills, MI (US); Ronald A. Mueller, Rochester Hills, MI (US)

(73) Assignee: Chrysler Group LLC, Auburn Hills, MI (US)

( * ) Notice: Subject to any disclaimer, the term of this patent is extended or adjusted under 35 U.S.C. 154(b) by 336 days.

(21) Appl. No.: 13/069,642

(22) Filed: Mar. 23, 2011

(65) Prior Publication Data

US 2012/0242466 A1    Sep. 27, 2012

(51) Int. Cl.
*B60Q 1/00* (2006.01)

(52) U.S. Cl.
USPC ..................................... 340/425.5

(58) Field of Classification Search
USPC ......... 340/425.5, 438, 458, 815.4; 362/23.01, 362/459; 320/137
See application file for complete search history.

(56) References Cited

U.S. PATENT DOCUMENTS

| | | | | |
|---|---|---|---|---|
| 5,757,595 | A * | 5/1998 | Ozawa et al. | 340/636.1 |
| 6,424,157 | B1 * | 7/2002 | Gollomp et al. | 324/430 |
| 8,179,245 | B2 * | 5/2012 | Chander et al. | 340/455 |
| 2006/0028178 | A1 | 2/2006 | Hobbs | |
| 2010/0140246 | A1 | 6/2010 | Grider et al. | |
| 2010/0161481 | A1 | 6/2010 | Littrell | |
| 2010/0235006 | A1 | 9/2010 | Brown | |
| 2010/0235024 | A1* | 9/2010 | Uchida | 701/22 |

FOREIGN PATENT DOCUMENTS

| | | |
|---|---|---|
| DE | 44 31 190 | 3/1996 |
| EP | 0 794 113 | 9/1997 |
| WO | 2010060556 | 6/2010 |

OTHER PUBLICATIONS

International Search Report and Written Opinion for PCT/US2012/026736 Mailed Sep. 25, 2012.

* cited by examiner

*Primary Examiner* — Phung Nguyen
(74) *Attorney, Agent, or Firm* — Frederick A. Krieger (57) ABSTRACT

An indicator system for a vehicle having an electric motor and a rechargeable battery can include an indicator having a body with a first end and a second opposite end. The body can include an indicator area defining a plurality of contiguous indicator segments therebetween. Each indicator segment can be configured to provide a separate status indication of at least one of a state of charge of the rechargeable battery, a state of a user specified vehicle feature condition, and a fault condition associated with charging of the rechargeable battery. The indicator can be mounted to a vehicle structure about the first end such that the second end extends away from the vehicle structure and the indicator area is externally visible relative to the vehicle from multiple viewpoints beyond a periphery of the vehicle.

20 Claims, 8 Drawing Sheets

EXTERNAL STATUS INDICATOR FOR AN ELECTRIC VEHICLE

FIELD

The present disclosure relates generally to a status indicator for an electric vehicle and, more particularly to a status indicator for at least the state of charge of a rechargeable battery for an electric vehicle.

BACKGROUND

Plug-in hybrid-electric and battery electric vehicles typically include an electric charging system that utilizes a rechargeable battery. The rechargeable battery can be configured to receive a charge or be recharged from an external power source, such as for example, a standard household outlet. Energy stored in the rechargeable battery can be used to propel the vehicle. One drawback of such conventional systems is a lack of feedback to a user of the vehicle regarding a state of charge of the rechargeable battery during recharging as well as a state of other vehicle conditions.

Thus, while the recharging systems have generally worked for their intended purpose, there remains a need for continuous improvement in the relevant art.

SUMMARY

In one form, an indicator system for a vehicle having an electric motor and a rechargeable battery is provided in accordance with the teachings of the present disclosure. The indicator system can include an indicator having a body with a first end and a second opposite end. The body can include an indicator area defining a plurality of contiguous indicator segments therebetween. Each indicator segment can be configured to provide a separate status indication of at least one of a state of charge of the rechargeable battery, a state of a user specified vehicle feature condition, and a fault condition associated with charging of the rechargeable battery. The indicator can be adapted to be mounted to a vehicle structure about the first end such that the second end extends away from the vehicle structure and the indicator area is externally visible relative to the vehicle from multiple viewpoints beyond a periphery of the vehicle.

In another form, a vehicle is provided in accordance with the teachings of the present disclosure. The vehicle can include an electric motor, a rechargeable battery coupled to the electric motor, a system control module in communication with the rechargeable battery, and a status indicator coupled to the vehicle and in communication with the system control module. The status indicator can include a body having a first end and a second opposite end, where the body defines an indicator area having a plurality of contiguous indicator segments therebetween including at least a lower indicator segment at the first end of the body and an upper indicator segment at the second end of the body. Each indicator segment can be configured to provide a separate status indication of at least one of a state of charge of the rechargeable battery in first color, a state of at least one user specified vehicle interior feature condition in a second color, and a fault condition associated with charging of the rechargeable battery in a third color. The status indicator can be mounted to a vehicle structure about the first end of the body such that the second end extends away from the vehicle structure and the indicator area is externally visible relative to the vehicle around an entire periphery of the vehicle.

Further areas of applicability of the teachings of the present disclosure will become apparent from the detailed description, claims and the drawings provided hereinafter. It should be understood that the detailed description, including disclosed embodiments and drawings references therein, are merely exemplary in nature intended for purposes of illustration only and are not intended to limit the scope of the present disclosure, its application or uses. Thus, variations that do not depart from the gist of the present disclosure are intended to be within the scope of the present disclosure.

DETAILED DESCRIPTION

Figure 1:
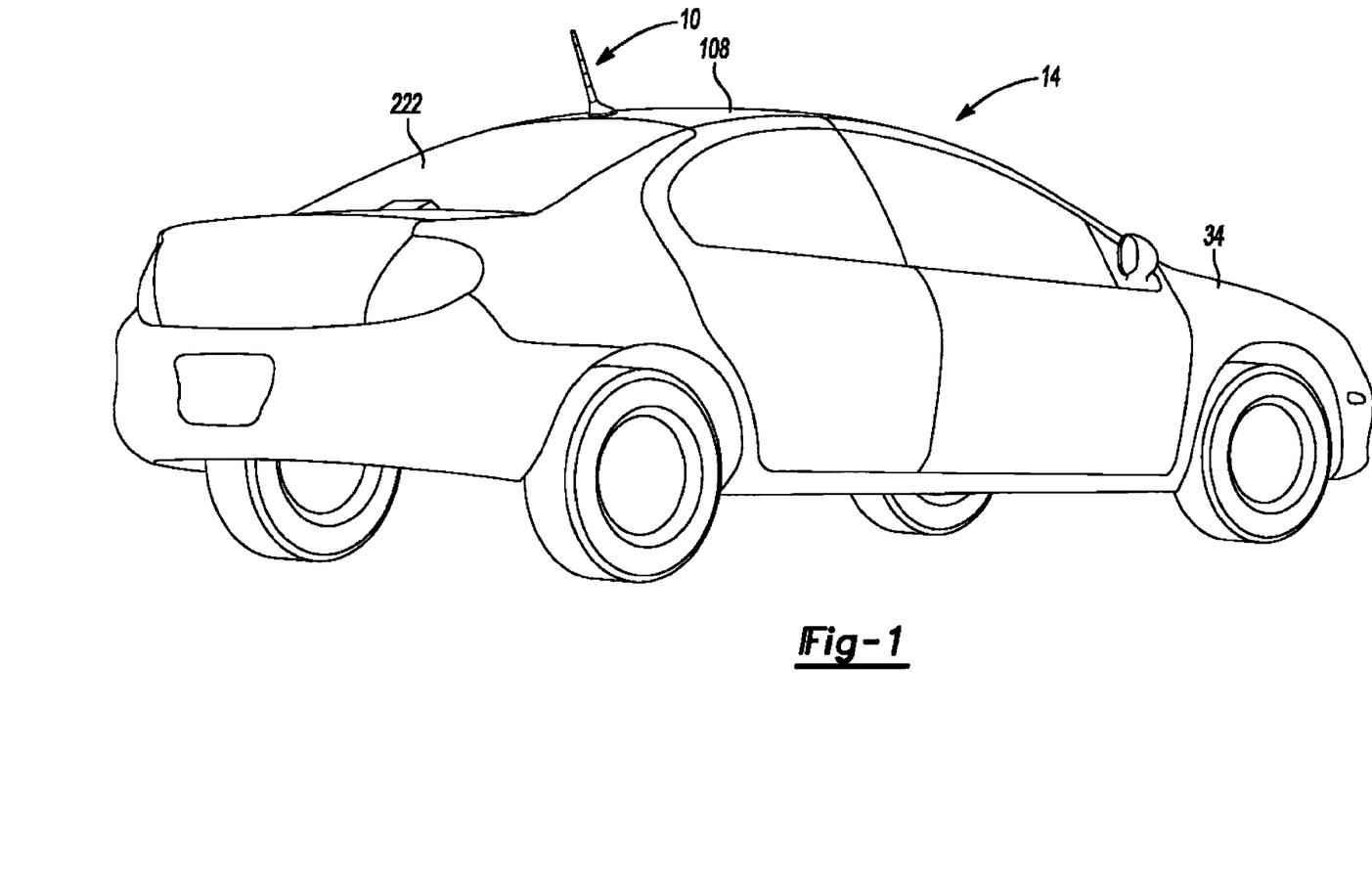
FIG. 1 is a perspective view of an exemplary external status indicator associated with an exemplary vehicle in accordance with the teachings of the present disclosure.
Figure 2A:
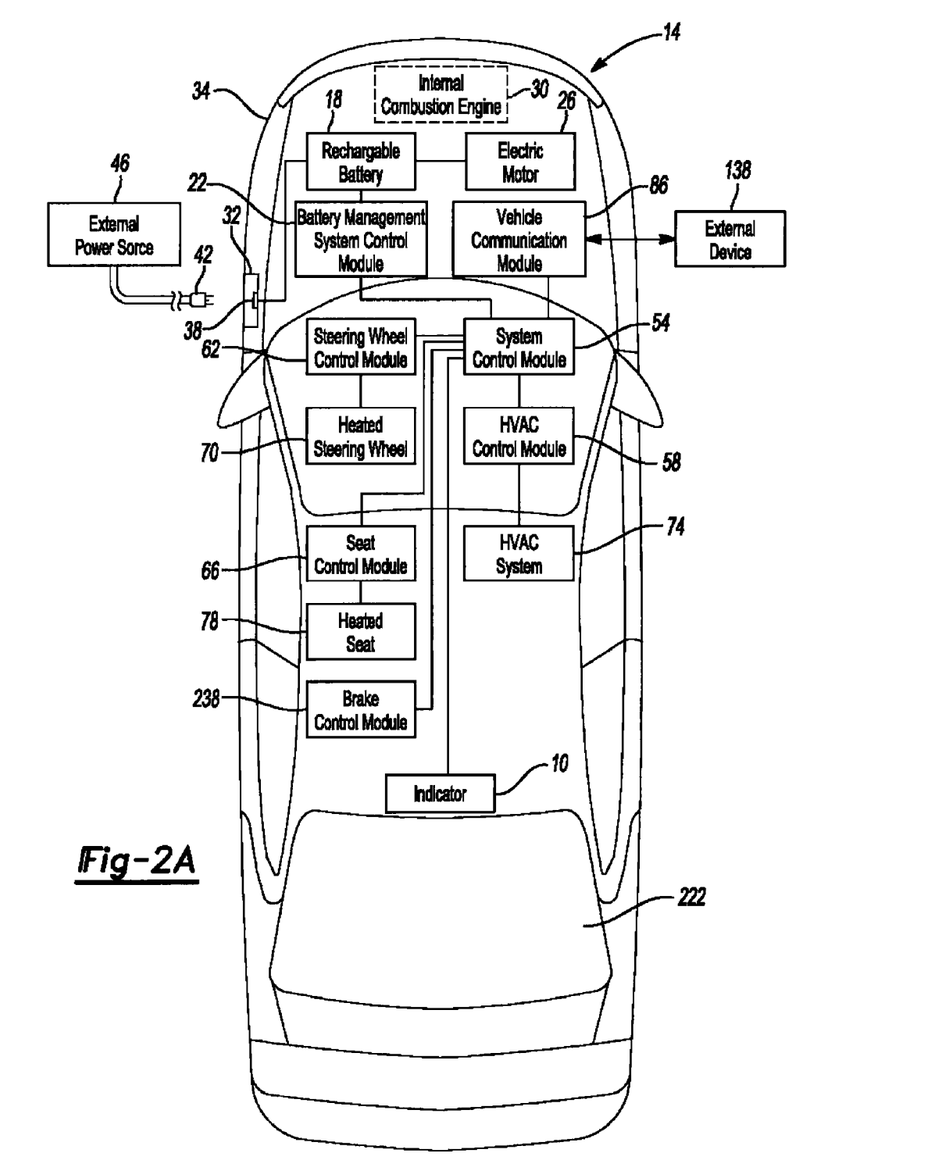
FIG. 2A is a schematic view of the exemplary vehicle of FIG. 1 illustrating the exemplary status indicator operatively associated therewith in accordance with the teachings of the present disclosure.
Figure 2B:
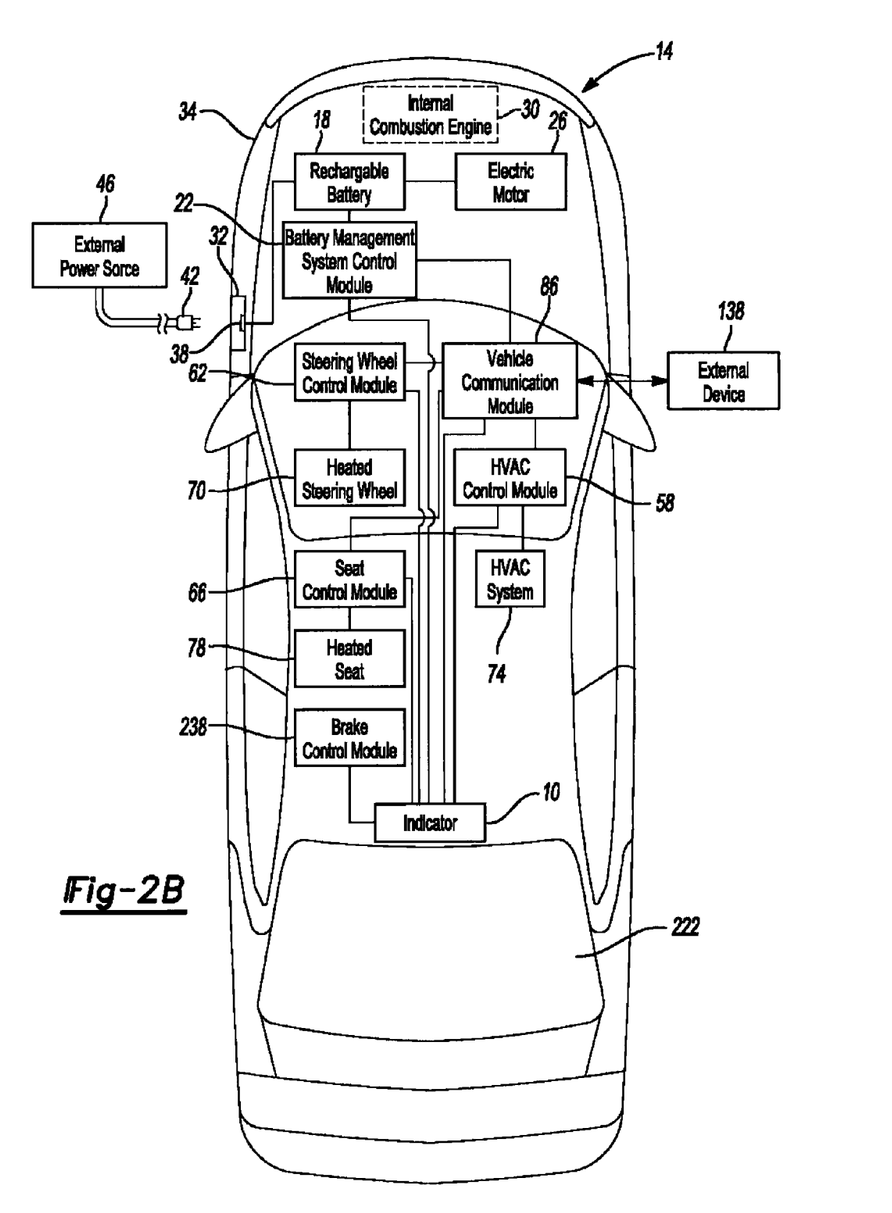
FIG. 2B is another schematic view of the exemplary vehicle of FIG. 1 illustrating the exemplary status indicator operatively associated therewith in accordance with the teachings of the present disclosure.
Figure 3:
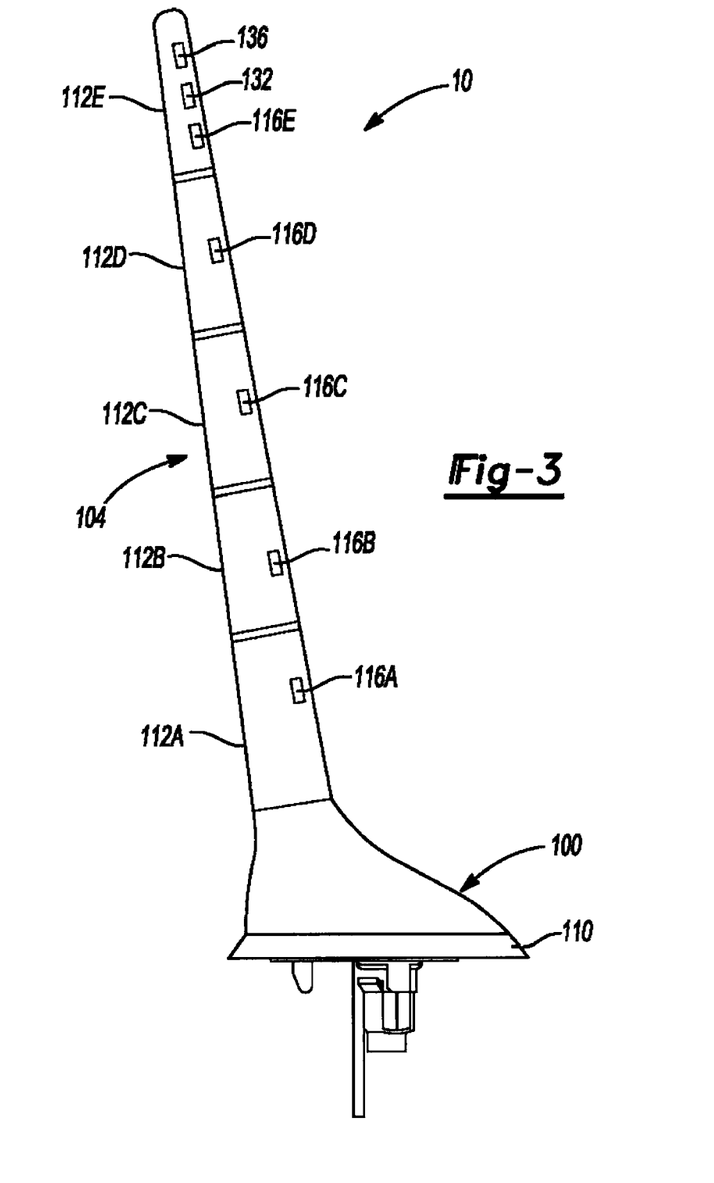
FIG. 3 is a side view of the exemplary status indicator in accordance with the teachings of the present disclosure.

With initial reference to FIGS. 1-2B, an exemplary external status indicator 10 is shown operatively associated with an exemplary electric vehicle 14 in accordance with the teaching of the present disclosure. External status indicator 10 is configured to visibly depict the state of charge of a rechargeable battery 18 of the vehicle 14 such that the status indication can be seen beyond a periphery of the vehicle from multiple viewpoints, and in some embodiments, seen from beyond an entire periphery of the vehicle, as will be discussed in greater detail below. Status indicator 10 can also be configured to visibly depict a status of various vehicle interior conditioning features as well as a fault condition associated with charging of the battery 18, as will also be discussed in greater detail herein. It should be appreciated that electric vehicle 14 is intended to include plug-in hybrid-electric vehicles, battery electric vehicles, and other hybrid-electric vehicles that utilize a rechargeable battery that can be recharged with an external power source. Further, while the following description will make reference to a rechargeable battery 18, it should be appreciated that electric vehicle 14 can include one or multiple rechargeable batteries 18. Additionally, it is contemplated that embodiments of the status indicator can be used with vehicles that utilize a fuel cell. The indicator can provide a visual indication of aspects of the fuel cell system such as an amount of energy in the fuel cell, a need for recharging the fuel cell, a hydrogen or other element level, an indication of a time or distance of travel capability, etc. and combinations thereof.

With particular reference to FIGS. 2A and 2B, electric vehicle 14 includes a battery management system control module 22 operatively associated with rechargeable battery 18 and at least one electric motor 26 of vehicle 14. In an exemplary configuration where electric vehicle 14 is a hybrid-electric vehicle, an internal combustion engine 30 can be optionally included to provide selective motive power to propel vehicle 14. In the exemplary configuration illustrated where electric vehicle 14 is a plug-in hybrid-electric vehicle, battery management system control module 22 is coupled to a port 32 accessible from an exterior 34 of vehicle 14. Port 32 includes a receptacle 38 configured to receive a plug 42 from a household outlet or other external power source 46 to recharge battery 18.

External status indicator 10 can be operatively associated with battery management system control module 22 as well as various other vehicle features to also provide a vehicle feature condition status indication. In the exemplary configuration illustrated in FIG. 2A, vehicle 14 includes a system control module 54 operatively associated with status indicator 10, battery management system control module 22, a heating, ventilation and air-conditioning (HVAC) control module 58, a steering wheel control module 62 and at least one seat control module 66. Steering wheel control module 62 is operatively associated with a heated steering wheel 70, HVAC control module 58 is operatively associated with a HVAC system 74, and seat control module 66 is operatively associated with at least one heated seat 78. The vehicle features can include those set by the vehicle user and factory established features for status indication. Other desirable vehicle features for status indication can include door/window/trunk ajar or open, low tire inflation, lights left on, low fuel level, transmission not in park, etc. The status indication of such features serves to remind the vehicle user of a vehicle condition the user may want to investigate or modify. In some embodiments, the system can be configured so the user can, utilizing the external device, configure/select the desired features for status indication, color choice, solid or blinking color display, etc. for use at one or more areas of the status indicator.

For example, a user can set a desired setting for one or more of the heated steering wheel 70, HVAC system 74 and heated seat 78, as is known in the art. When vehicle 14 is electrically coupled to external power source 46, system control module 54 can be configured to monitor a status of the user specified setting of one or more of the heated steering wheel 70, HVAC system 74 and heated seat 78. System control module 54 can be configured to provide a status indication to the status indicator 10 when all of the user selected interior conditioning systems have reached the user specified settings, as will be discussed below in greater detail. System control module 54 can also be configured to receive a remote signal form a user via communication module 86 to initiate charging and/or remotely specify a desired setting for one or more of the heated steering wheel 70, HVAC system 74 and heated seat 78. For example, a user can interface with communication module 86 via a key fob, mobile device and/or a computer. While FIGS. 2A and 2B illustrate separate control modules for the heated steering wheel 70, HVAC system 74 and heated seat 78, it should be appreciated that vehicle 14 can alternatively use a single control module, such as a body controller, to control features associated with each of the heated steering wheel 70, HVAC system 74 and heated seat 78.

In an alternative configuration illustrated in FIG. 2B, vehicle 14 can include the vehicle communication module 86 in place of the system control module 54. In this configuration, the battery management system control module 22, HVAC control module 58, steering wheel control module 62 and heated seat control module 66 are each configured to individually communicate with external status indicator 10. Status indicator 10 can be configured to process signals received from the associated control modules and provide the state of charge status indication and/or the vehicle condition status indication discussed above.

With additional reference to FIGS. 3-6, external status indicator 10 will now be described in greater detail. External status indicator 10 can include a base 100 and an indicator member 104 extending therefrom, as shown for example in FIG. 3. Base 100 can be used to facilitate securing indicator 10 to vehicle 14 in a suitable manner, such as with fasteners or another fastening arrangement. In the exemplary configuration illustrated, base 100 is used to secure indicator 10 to a roof 108 of vehicle 14 to maximize a viewing potential of the status indicators provided by indicator 10 around an entire periphery or 360 degrees of vehicle 14. Base 100 can optionally include a sealing member 110 around a lower perimeter thereof to provide a watertight connection to roof 108 of vehicle 14. It should be appreciated that while the indicator member 104 has been illustrated with an elongated shape, the illustrated elongated shape is merely exemplary and can be altered while ensuring that the status indications are externally visible relative to the vehicle 14 around an entire periphery of the vehicle 14. It is to be understood in some of the following exemplary embodiments the status indicator, depending on the indicator configuration, may include a dual set of indicator light sources, one set on each side of the indicator, even though only one set of indicator light sources are shown on one side of the status indicator so the status indications are externally visible around an entire periphery of the vehicle. In some embodiments, the indicator configuration can include a shape (e.g. tapered or wedge-shaped cross-sections for 112A-112E of FIG. 3 having the light sources disposed thereon) for better enabling viewing the status indications around an entire periphery of the vehicle.

Indicator member 104 can be formed of a translucent material, such as plastic, and can be divided or partitioned into a plurality of segments 112. In the exemplary configuration illustrated in FIG. 13, indicator member 104 can include five segments 112A-112E. The segments 112 can be individually illuminated, such as with one or more light sources, to provide various externally visible status indications to a user, as will be discussed below. In the exemplary configuration illustrated in FIGS. 3-6, segments 112A-112D of indicator member 104 each include a light source 116 configured to be selectively illuminated based on a state of charge of rechargeable battery 18. Light source 116 can be individual light sources 116A-116D, such as individual light emitting diodes (LEDs) associated with respective segments 112A-112D, or one light source with a plurality of associated light emitting areas operatively associated with respective segments 112A-

112D. Light sources 116A-116D of indicator 10 are operatively associated with the system control module 54 or battery management system control module 22 of FIGS. 2A and 2B, respectively. As will be discussed below, segment 112E can be a multi-functional segment used to display vehicle feature condition status information and battery charging fault information, as well as can also be used to display state of charge information via optional light source 116E.

Figure 4A:
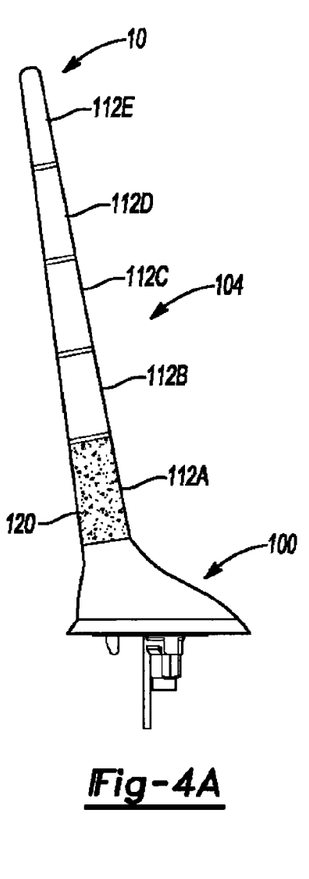
FIGS. 4A to 4D are side views of the status indicator of FIG. 3 illustrating exemplary state of charge indications in accordance with the teachings of the present disclosure.
Figure 4B:
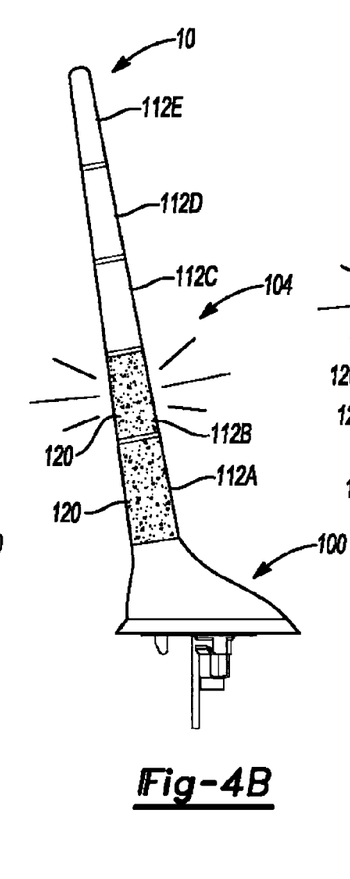
Figure 4C:
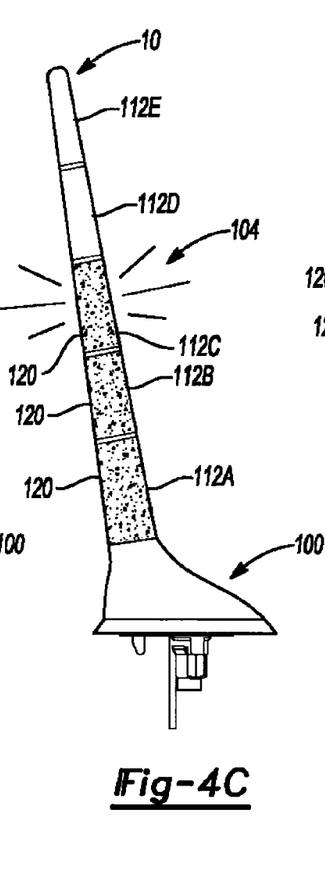
Figure 4D:
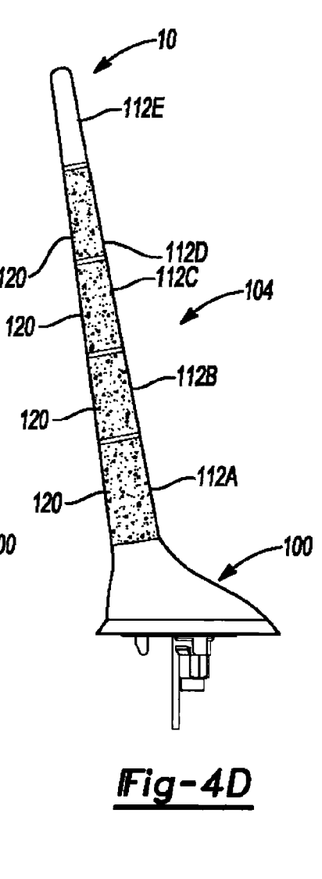
Figure 5:
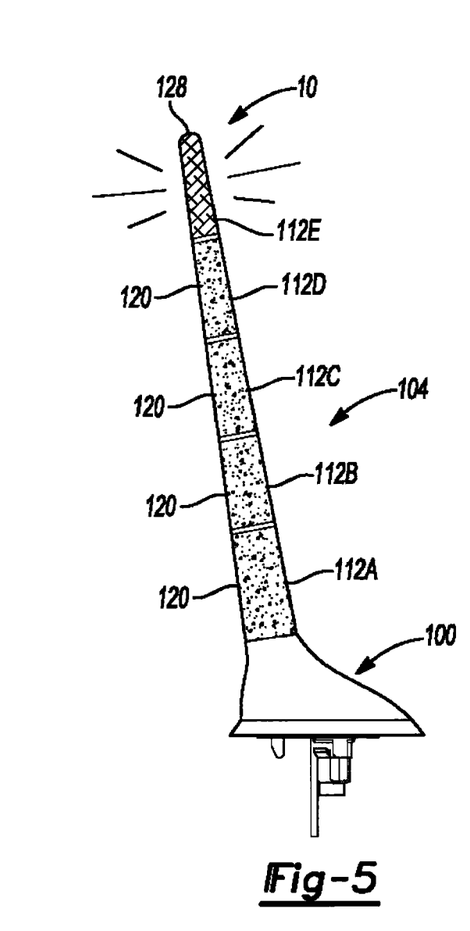
FIG. 5 is a side view of the status indicator of FIG. 3 illustrating a status of an exemplary vehicle interior condition in accordance with the teachings of the present disclosure.

Battery management system control module 22 can be configured to individually, or through system control module 54, communicate with indicator 10 to provide a state of charge status indication 120 regarding rechargeable battery 18, as shown in FIGS. 4 and 5. In particular, when vehicle 14 is electrically coupled to external power source 46, control module 22 and/or system control module 54 can be configured to progressively illuminate light sources 116A-116D of segments 112A-112D as the state of charge of battery 18 increases. For example, light source 116A of segment 112A can be illuminated when the state of charge of battery 18 is between 0 and 25% (FIG. 4A), light source 116B of segment 112B can be additionally illuminated when the state of charge is between 25% and 50% (FIG. 4B), light source 116C of segment 112C can be additionally illuminated when the state of charge is between 50% and 75% (FIG. 4C), and light source 116D can be additionally illuminated when the state of charge is between 75% and 100% (FIG. 4D).

Battery management system control module 22 and/or system control module 54 can also be configured to cause each light source 116A-116D to blink or flash as the state of charge of battery 18 is progressing through the threshold limits of each particular segment. For example, and with reference to FIG. 4B, as the state of charge of battery 18 is progressing between 25% and 50%, which falls within segment 112B, associated light source 116B can blink or flash until the state of charge reaches 50% upon which light source 116B will be controlled to be solid or continuous and light source 116C will be controlled to start flashing, as shown in FIG. 4C. When battery 18 is fully charged, control module 22 and/or control module 54 will cause light sources 116A-116D to be illuminated thereby providing solid or continuous illumination of segments 112A-112D to provide the visual, external state of charge status indication that battery 18 is fully charged, as shown in FIG. 4D.

In an alternative configuration, segment 112E can include light source 116E, which also can be operatively associated with battery management system control module 22 and/or system control module 54. In this configuration, indicator 10 can operate as discussed above, except each segment 112A-112E will be configured to progressively indicate 20% increments of state of charge status indications 120 for rechargeable battery 18. When battery 18 is fully charged, control module 22 and/or control module 54 will cause light sources 116A-116E to be illuminated thereby providing solid or continuous illumination of segments 112A-112E to provide the visual, external state of charge status indication that battery 18 is fully charged.

As briefly discussed above, segment 112E of external status indicator 10 can be controlled to provide a status indication of one or both of a fault condition status 124 (FIG. 6) associated with the battery 18 and/or battery management system control module 22, and a status of the user selected vehicle interior preconditioning 128 (FIG. 5). Segment 112E of indicator member 104 can include additional light sources 132 and 136 configured to be selectively illuminated in connection with the fault condition status 124 and the condition status 128, respectively, as will be discussed below.

While indicator member 104 of indicator 10 has been discussed above as including five segments 112A-112E, it should be appreciated that indicator member 104 can alternatively include more or fewer segments, such as for example only four segments 112A-112D. In an alternative configuration with more or fewer segments, the top segment opposite the base of the indicator would be the multifunctional segment selectively providing the visible status indications regarding feature condition, any fault condition and optionally state of charge.

In a configuration with only four segments 112A-112D, the top segment 112D can be used to selectively provide an indication of the state of charge status 120 of battery 18, the fault condition status 124 and the feature condition status 128 of vehicle 14, similar to segment 112E in the exemplary configuration discussed above. In this regard, segment 112D would include light sources 116D, 132 and 136. Each of the four segments would be used to represent twenty-five percent of the total charge of battery 18. Thus, although the description of the indicator continues with a discussion of the five segments 112A-112E, it should be appreciated that the discussion of multi-functional segment 112E applies equally to segment 112D for the four segment configuration.

Figure 6:
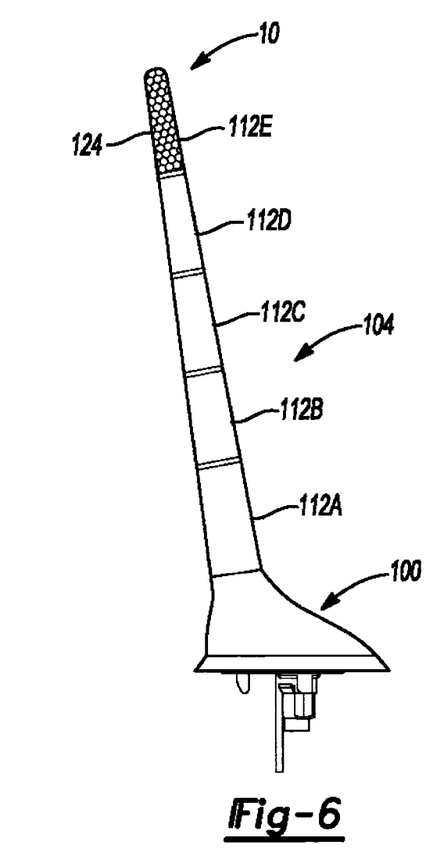
FIG. 6 is a side view of the status indicator of FIG. 3 illustrating a status of an exemplary fault condition in accordance with the teachings of the present disclosure.

Regarding the fault condition status 124, battery management system control module 22 and/or system control module 54 can be configured to cause light source 132 to be selectively illuminated, and thereby cause segment 112E to be illuminated when modules 22 and/or 54 determine a fault condition exists in connection with charging of battery 18, as shown in FIG. 6. Light source 132 can be controlled to be illuminated in a solid/continuous manner, or in a blinking or flashing manner. When the fault condition is determined to exist, the state of charge status indication 120 of battery 18 will not be provided by control modules 22 and/or 54 to indicator 10. In some embodiments, the status indications can include solid and flashing colors and different colors for varying degrees of fault/success status such as solid yellow when the feature is in a problem mode, flashing red when battery charging is not possible, battery temperature is too high, flashing red for a low tire inflation, and light combinations thereof.

As briefly discussed above, a vehicle user or customer can remotely communicate with vehicle 14 via an external device 138 (FIGS. 2A and 2B) and communication module 86 to select or specify (e.g. interior) condition features when vehicle 14 is electrically coupled to external power source 46. In particular, the user can set a desired setting for the heated steering wheel 70, HVAC system 74, and/or the heated seat(s) 78. The system control module 54 is operatively connected to the indicator 10, and in particular, is configured to selectively illuminate light source 136 to provide status indication 128 for the user selected interior condition features reaching the selected customer setting, as shown in FIG. 5.

For example, the user can remotely connect with vehicle 14 via external device 138, such as a computer, mobile phone, or key fob, and configure the HVAC system 74 to heat the vehicle to an interior temperature of 70 degrees Fahrenheit. The user could additionally set the heated steering wheel 70 and/or heated seat 78 to a desired low or high setting. The system control module 54 is configured to monitor the associated control modules 58, 62 and 66 and cause light 136 of indicator 10 to illuminate upon each of the user selected interior conditioning features reaching the desired user setting. In this regard, light source 136 can be controlled to illuminate in a blinking or flashing manner while the user selected interior condition features are on, but have not reached the desired customer setting, as shown in FIG. 5.

Once the features have reached the desired setting, light 136 can be controlled to be illuminated in a solid or continuous manner. In addition, in a scenario where vehicle 14 is both fully charged and the user has selected certain features or systems for interior condition, the top segment 112D or 112E can be configured to alternately illuminate light source 116D/E and light source 136 in the manner discussed above to provide the visual status indications 120, 128 for both the state of charge of battery 18 and the state of the vehicle interior features condition.

To differentiate between the visual status indications 120, 124 and 128 provided by respective light sources 116, 132 and 136, each of the light sources are configured to illuminate with a different color light. For example, light sources 116A-116D/E, each are configured to illuminate with the same color. In the exemplary configurations illustrated, light sources 116 illuminate light with a blue color, light source 132 illuminates with a red color, and light source 136 illuminates light with a yellow color. It should be appreciated that while the drawings illustrate patterns associated with indicator 10 and illumination of light sources 116, 132, 136, these patterns are for drawing illustration purposes and are used to designate different colors being associated with the respective light sources. It should also be appreciated that light sources 116, 132 and 136 can be a single light source configured to be selectively illuminated in the above-discussed colors, or separate lights sources, or combinations thereof.

Figure 7:
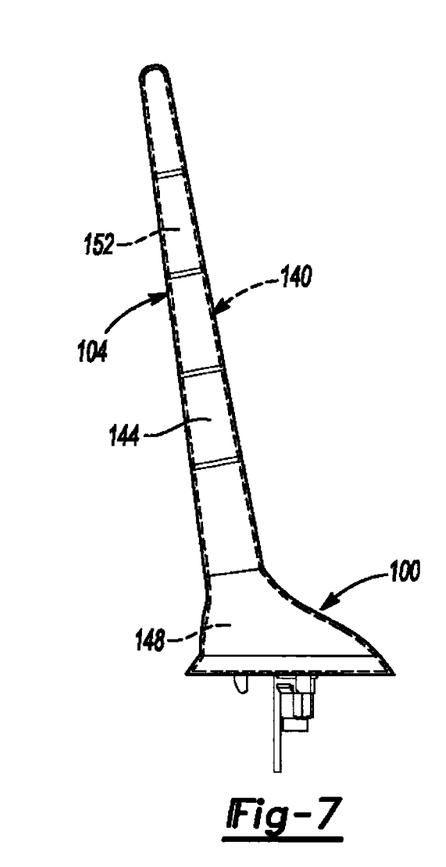
FIG. 7 is a side view of the status indicator of FIG. 3 illustrating an exemplary radio antenna housed within the status indicator in accordance with the teachings of the present disclosure.

With additional reference to FIG. 7, external status indicator 10 can optionally include an antenna arrangement 140 incorporated into a hollow interior 144 of status indicator 10. In the exemplary configuration illustrated, antenna arrangement 140 includes both a satellite antenna 148 and an AM/FM antenna 152. External status indicator 10 can include a shape that substantially conforms to the shape of antenna 140, as shown. The combined status indicator 10 and antenna arrangement 140 can provide cost savings and complexity reduction for the vehicle 14.

Figure 8:
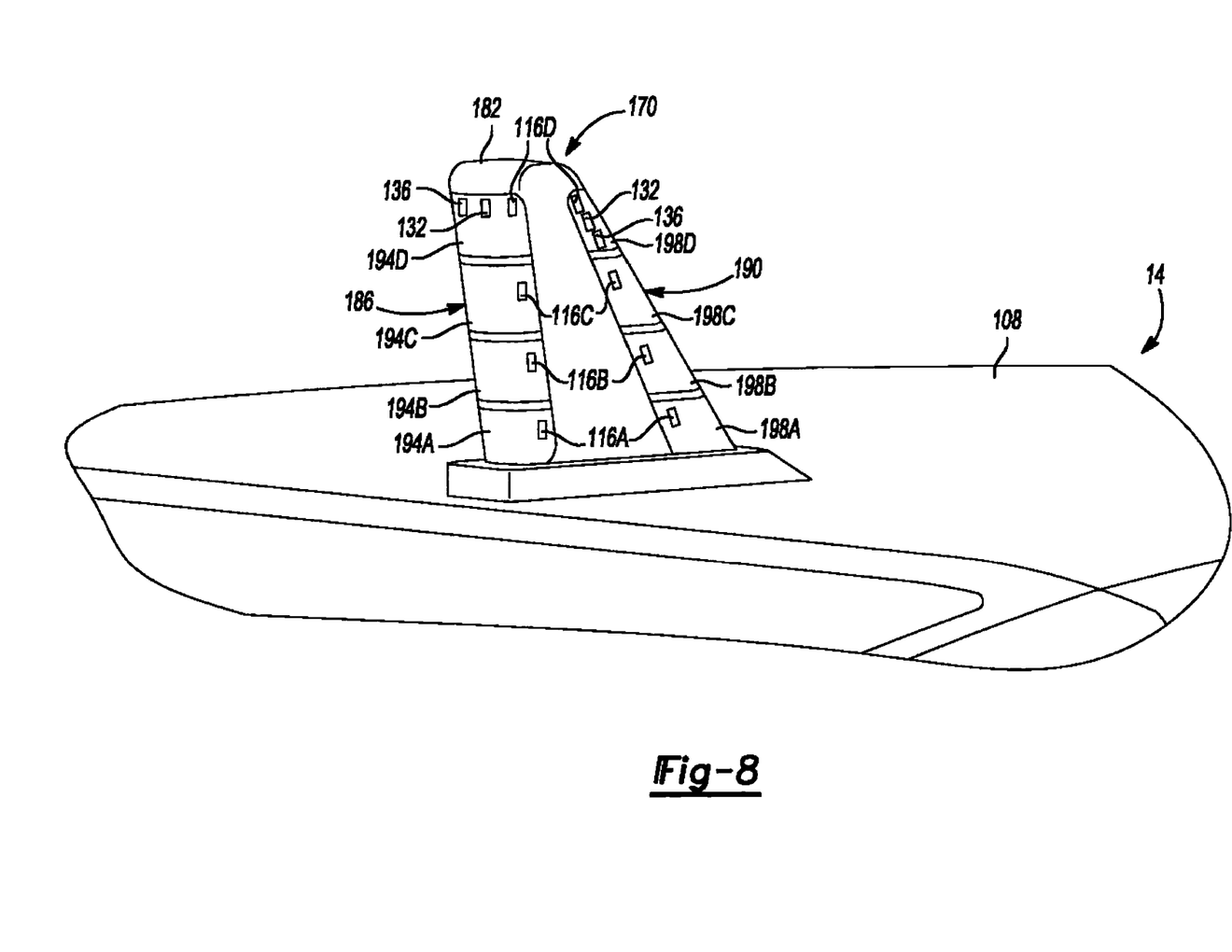
FIG. 8 is a perspective view of an exemplary alternative status indicator associated with the exemplary vehicle in accordance with the teachings of the present disclosure.

Turning now to FIG. 8, and with reference back to FIGS. 2A and 2B, an alternative external status indicator 170 will be discussed in accordance with the present teachings, where like reference numerals indicate like features to those previously introduced. Status indictor 170 can be mounted on roof 108 and can include a body 182 and first and second indicator areas 186 and 190, respectively. Indicator area 186 can be positioned on a rearward side of body 182 and indicator area 190 can be positioned on a forward side of body 182. Indicator areas 186, 190 can each be segmented into four or five indicator segments, as discussed above, while noting that more or fewer segments can alternatively be utilized.

In the exemplary configuration illustrated in FIG. 8, indicator areas 186, 190 are each segmented into four segments 194A-194D and 198A-198D, respectively. Segments 194A-194D and 198A-198D of respective indicator areas 186, 190 can be configured to operate in the same manner as discussed above in connection with the configuration of indicator 10 having only the four segments 112A-112D. In this regard, each of the segmented indicator areas 186, 190 can include light sources 116A-116D, 132 and 136 in the same manner as discussed above to provide the state of charge status indication 120, fault status indication 124 and preconditioning status indication 128, respectively.

The corresponding segments of each of the indicator areas 186, 190 can be controlled to be illuminated simultaneously. For example, in a charging condition where battery 18 has a state of charge of fifteen percent, segment 194A and segment 198A can be illuminated simultaneously. In addition, top segments 194D and 198D are the multi-functional segments controlled to selectively illuminate the appropriate status indications of state of charge 120, fault 124 and/or preconditioning 128, as discussed above.

Figure 9:
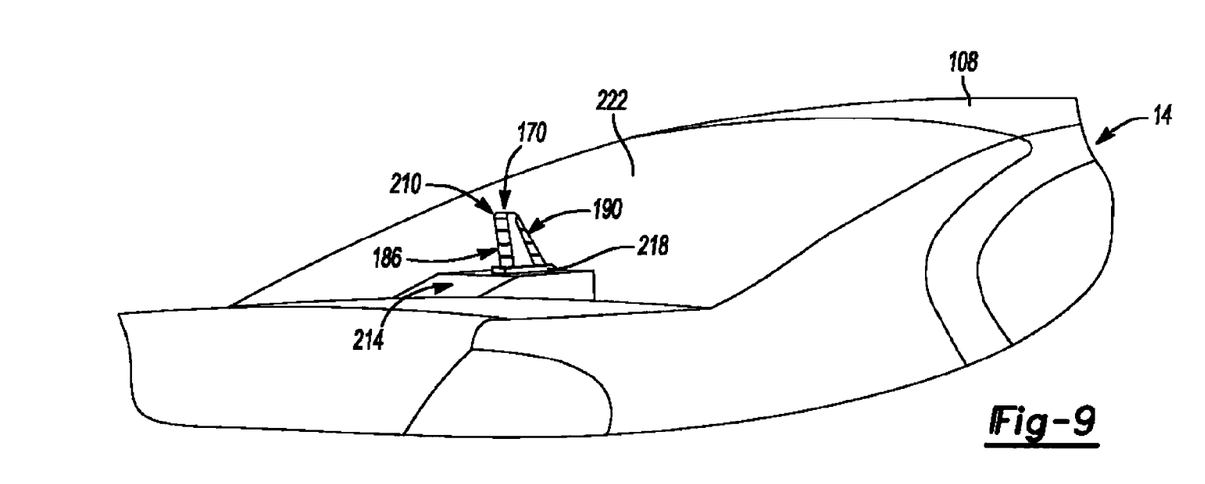
FIG. 9 is a side view of the exemplary alternative status indicator of FIG. 8 associated with an exemplary center mounted stop lamp in accordance with the teachings of the present disclosure.

Turning now to FIG. 9, and with continuing reference back to FIGS. 2A and 2B, an alternative external status indicator assembly 210 will be discussed in accordance with the present teachings, where like reference numerals indicate like features to those previously introduced. Status indictor assembly 210 can include the status indicator 170 incorporated into an assembly with a center mounted stop Lamp (CMSL) 214, as shown in FIG. 9. In the illustrated configuration, CMSL 214 is positioned about a lower side 218 of status indicator 170, as also shown in FIG. 9. Status indicator assembly 210 is shown mounted proximate a rear window 222 in a location visible around the entire perimeter of vehicle 14, similar to external status indicators 10 and 170 discussed above.

Figure 10:
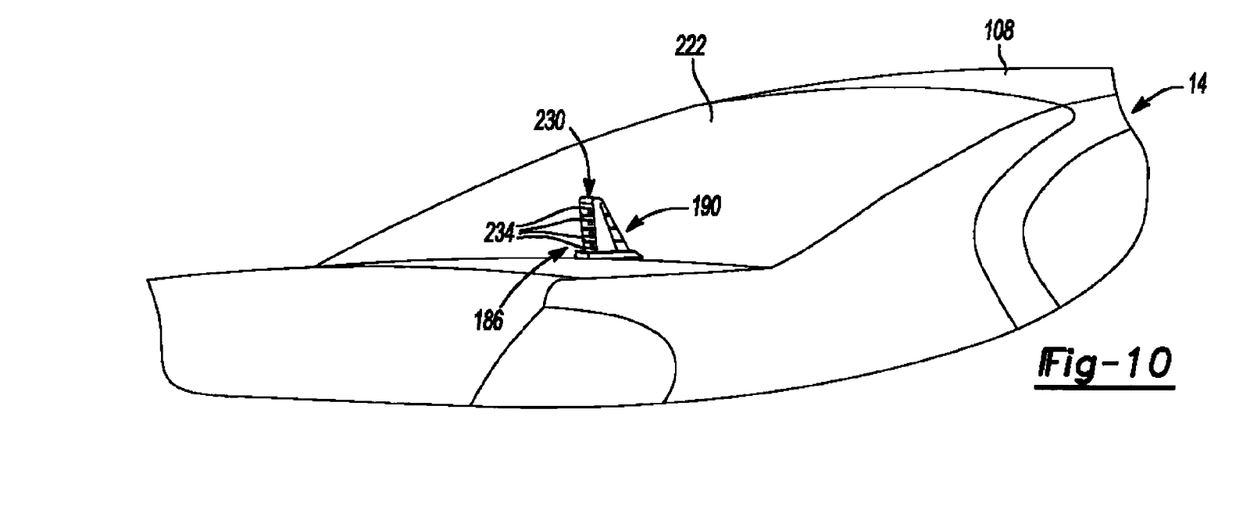
FIG. 10 is a perspective view of an exemplary alternative status indicator of FIG. 8 including an exemplary center mounted stop lamp operation in accordance with the teachings of the present disclosure.

Turning now to FIG. 10, and with similar reference back to FIGS. 2A and 2B, an alternative external status indicator 230 will be discussed, where like reference numerals indicate like features to those previously introduced. Status indicator 230 is substantially similar to status indicator 170, such that only differences between status indicator 170 and status indicator 230 will now be discussed. Status indicator 230 can function as both an external status indicator and a CMSL, as will be discussed below. In this regard, when the vehicle 14 is under operation and not coupled to the external power source 46, the first indicator area 186 can serve as the CMSL, while the second indicator area 190 is not illuminated.

In this exemplary configuration, each segment 194A-194D of the first indicator area 186 can include an additional light source 234 configured to illuminate indicator area 186 upon receipt of a signal from a brake system control module 238 indicative of a user applying the brakes of vehicle 14. When vehicle 14 is coupled to the external power source 46, system control module 54 can control indicator area 186 to function in the same manner as discussed above in connection with status indicator 210. Thus, status indicator 230 can serve the dual purpose of a CMSL when de-coupled from external power source 46, and as an indicator for the battery state of charge, fault, and/or preconditioning status indications 120, 124, 128 when coupled to the external power source 46.

Each of the status indicators 10, 170 and 230 can each be sized and shaped so as to provide the above-discussed indications of state of charge 120, fault 124 and/or condition 128, so that the vehicle user or customer can visually see the indications from a distance (e.g. at least twenty yards) away from the vehicle in any direction. To accomplish this, the respective indicators include a placement on the vehicle, such as on the roof or proximate the rear window, so as to be visible from around the entire periphery of the vehicle. Such placement provides the vehicle user with at least the ability to couple their vehicle to an external power source that may be remote from their desired location at that time, such as an external power source in an office parking lot or the like. In this regard, the user could, for example, then determine the state of charge and/or feature condition of their vehicle from inside the office building by merely observing the colored status indications being provided by one of the respective indicators 10, 170 or 230.

It should be understood that the mixing and matching of features, elements and/or functions between various examples may be expressly contemplated herein so that one skilled in the art would appreciate from the present teachings that features, elements and/or functions of one example may be incorporated into another example as appropriate, unless described otherwise above.

What is claimed is:

1. An indicator system for a vehicle having an electric motor and a rechargeable battery, comprising:
an indicator including a body having a first end and a second opposite end, the body having an indicator area defining a plurality of contiguous indicator segments therebetween, each indicator segment configured to provide a separate status indication of at least one of a state of charge of the rechargeable battery, a state of a user specified vehicle feature condition, and a fault condition associated with charging of the rechargeable battery;
wherein the indicator is adapted to be mounted to a vehicle structure about the first end such that the second end extends away from the vehicle structure and the indicator area is externally visible relative to the vehicle from multiple viewpoints beyond a periphery of the vehicle.

2. The indicator system of claim 1, wherein the indicator is configured to illuminate the indicator area in a first color to selectively provide the status of the state of charge of the battery, in a second color to selectively provide the status of the state of the feature condition, and in a third color to selectively provide the status of the fault condition, and wherein the first, second and third colors are different.

3. The indicator system of claim 2, wherein the indicator includes at least one light source configured to illuminate at least one of the segments of the indicator area in the first color, the second color, and the third color.

4. The indicator system of claim 2, wherein the indicator is configured to progressively illuminate each of the plurality of segments in the first color from a first segment of the plurality of segments at the first end of the body to a last segment of the plurality of segments at the second end of the body as the state of charge of the battery progressively increases to fully charged such that all of the segments are illuminated when the battery is fully charged.

5. The indicator system of claim 2, wherein the plurality of segments includes four segments with a first segment being at the first end and a fourth segment being at the second end of the body, the four segments configured to progressively illuminate from the first segment to the fourth segment as the state of charge of the battery increases to fully charged, each segment representing twenty-five percent of a charge capacity of the battery.

6. The indicator system of claim 5, wherein the indicator is configured to illuminate the first segment for a state of charge of the battery of zero to twenty-five percent, to additionally illuminate the second segment for a state of charge of twenty-six to fifty percent, to additionally illuminate the third segment for a state of charge of fifty-one to seventy-five percent, and to additionally illuminate the fourth segment for a state of charge of seventy-six to one hundred percent.

7. The indicator system of claim 5, wherein the indicator is configured to illuminate each segment in a flashing manner when the status of the sate of charge of the battery is between a lower and upper threshold of that particular segment, and to illuminate each segment in a solid or continuous manner when the status of the state of charge with respect to that particular segment is equal to or beyond the upper threshold of that particular segment.

8. The indicator system of claim 5, wherein the fourth segment is configured to be selectively illuminated in the second color to provide the status of the state of the vehicle feature condition, and the third color to provide the status of the fault condition.

9. The indicator system of claim 1, wherein the vehicle feature condition includes at least one of a heated steering wheel, a heated seat, and a heating, ventilation and air-conditioning system.

10. The indicator system of claim 1, wherein the indicator is configured to be mounted to a roof of the vehicle such that the first end of the body is adjacent the roof.

11. The indicator system of claim 1, wherein the indicator area and the plurality of segments are sized and shaped to be externally visible relative to the vehicle from a distance of at least twenty yards away from the vehicle.

12. The indicator system of claim 1, wherein the first color includes a blue color, the second color includes a yellow color, and the third color includes a red color.

13. The indicator system of claim 1, wherein the indicator body includes a hollow interior, and wherein the indicator system further includes a radio antenna arrangement configured to be received within the hollow interior of the indicator.

14. The indicator system of claim 1, further comprising a light source configured to illuminate each segment of the indicator area when the vehicle is decoupled from an external power source configured to recharge the battery and upon application of a braking system of the vehicle.

15. A vehicle, comprising:
an electric motor;
a rechargeable battery coupled to the electric motor;
a system control module in communication with the rechargeable battery; and
a status indicator coupled to the vehicle and in communication with the system control module, including:
a body having a first end and a second opposite end, the body defining an indicator area having a plurality of contiguous indicator segments therebetween including at least a lower indicator segment at the first end of the body and an upper indicator segment at the second end of the body, each indicator segment configured to provide a separate status indication of at least one of a state of charge of the rechargeable battery in first color, a state of at least one user specified vehicle feature condition in a second color, and a fault condition associated with charging of the rechargeable battery in a third color, the system control module coupled to the status indicator;
wherein the status indicator is mounted to a vehicle structure about the first end of the body such that the second end extends away from the vehicle structure and the indicator area is externally visible relative to the vehicle from multiple viewpoints beyond a periphery of the vehicle.

16. The vehicle of claim 15, wherein the plurality of segments includes four segments, and wherein the system control module is configured to selectively illuminate each of the four segments in the first color from a first segment at the first end of the body to a fourth segment at the second end of the body as the state of charge of the battery progressively increases to fully charged such that all of the segments are illuminated in the first color when the battery is fully charged.

17. The vehicle of claim 16, wherein the at least one user specified feature condition includes at least one of a heated steering wheel, a heated seat, and a heating, ventilation and air-conditioning system, and wherein the system control module is configured to selectively illuminate the fourth segment in the second color to indicate a status of the state of the at least one vehicle feature condition in a flashing manner when the at least one vehicle feature condition has not reached a user specified setting, and in a solid manner when the at least one vehicle feature condition has reached the user specified setting.

18. The vehicle of claim 17, wherein the system control module is configured to receive a remote signal from the user indicative of a specified user setting for the at least one vehicle feature condition.

19. The vehicle of claim 16, wherein the system control module is configured to provide the at least one of the separate status indications to the status indicator only when the vehicle is electrically coupled to an external power source configured to recharge the battery, and is configured to illuminate each of the four segments simultaneously only when the vehicle is decoupled from the external power source and in response to the system control module receiving a signal indicative of a braking system of the vehicle being activated by the user.

20. The vehicle of claim 16, wherein the indicator is mounted to a roof of the vehicle such that the first end of the body is adjacent the roof, and wherein the indicator area and the four segments are sized and shaped to be externally visible relative to the vehicle around an entire periphery of the vehicle from a distance of at least twenty yards away.

\* \* \* \* \*